United States Patent [19]
Dell et al.

[11] Patent Number: 6,111,757
[45] Date of Patent: Aug. 29, 2000

[54] SIMM/DIMM MEMORY MODULE

[75] Inventors: Timothy Jay Dell, Colchester; Mark William Kellogg; Bruce Gerard Hazelzet, both of Essex Junction, all of Vt.

[73] Assignee: International Business Machines Corp., Armonk, N.Y.

[21] Appl. No.: 09/007,941

[22] Filed: Jan. 16, 1998

[51] Int. Cl.$^7$ .................................. G11C 5/06; G11C 8/12
[52] U.S. Cl. ........................ 361/737; 361/777; 361/785; 361/803; 710/102; 365/51; 365/230.03; 439/218
[58] Field of Search .................................... 361/737, 748, 361/777, 785, 788, 803; 711/105, 115; 364/953.3; 439/62, 217, 218; 395/282, 283; 710/101, 102, 104; 365/51, 52, 230.03

[56] References Cited

U.S. PATENT DOCUMENTS

| | | | |
|---|---|---|---|
| 4,647,123 | 3/1987 | Chin et al. | 361/785 |
| 4,885,482 | 12/1989 | Sharp et al. | 439/218 |
| 5,040,153 | 8/1991 | Fung et al. | 365/230.03 |
| 5,163,833 | 11/1992 | Olsen et al. | 361/785 |
| 5,189,598 | 2/1993 | Bolan et al. | 361/748 |
| 5,619,471 | 4/1997 | Nunziata | 365/230.03 |
| 5,748,912 | 5/1998 | Lee | 395/282 |
| 5,831,925 | 11/1999 | Brown et al. | 365/230.03 |
| 5,995,376 | 11/1999 | Schultz et al. | 361/788 |

FOREIGN PATENT DOCUMENTS

| | | | |
|---|---|---|---|
| 0 356 757 A2 | 3/1990 | European Pat. Off. | 439/59 |
| 38 08 364 A1 | 9/1989 | Germany | 439/59 |

OTHER PUBLICATIONS

Adapter Card for Personal Computer, IBM Technical Disclosure Bulletin, vol. 31, No. 5, pp. 131–132, Oct. 1988.

*Primary Examiner*—Ryung Sub Sough
*Assistant Examiner*—John B. Vigushin
*Attorney, Agent, or Firm*—Thornton & Thornton; Francis J. Thornton; Robert A. Walsh

[57] ABSTRACT

A memory module configured such that it can be operated as a first memory module such as a (Single In-line Memory Module) SIMM or as a second memory module such as a (Dual In-line Memory Module) DIMM module without requiring external switching circuitry. This is accomplished by providing a memory module card with a circuit thereon that is designed to emulate a DIMM module when plugged into a DIMM socket as found in the latest computer architectures and to emulate a SIMM module when plugged into a SIMM socket as found in older computer architectures. The memory module is provided with memory devices (DRAMS or SDRAMS) and interconnecting bypass devices (CMOS transistor pairs) mounted thereon. The bypass devices and are also connected to terminal pads adjacent the first and second edges of the module, such that upon insertion of a first edge into a mating DIMM socket, the bypass devices are activated to interconnect the memory devices as, for example, a 1 bank 168 pin DIMM and upon insertion of the second edge into a SIMM socket, the memory devices are interconnected as, for example, a 2 bank 72 pin SIMM. The present invention decreases the need for manufacturing and maintaining separate SIMM and DIMM inventories and provides the capability of extending and expanding existing computer systems if the memory modules or cards originally designed for the computer are deleted from future inventories or become prohibitively expensive or difficult to locate.

13 Claims, 3 Drawing Sheets

SIMM/DIMM MEMORY MODULE

FIELD OF THE INVENTION

This invention relates generally to computer memories. More particularly, the invention relates to a memory module, configured such that it can be operated as either a 2 bank (Single In-line Memory Module) SIMM or as a 1 bank (Dual In-line Memory Module) DIMM without requiring external switching circuitry.

BACKGROUND OF THE INVENTION

Computers use numerous memory units such as Dynamic Random Access Memory units (DRAMs or Synchronous Random Access Memory Units SDRAMs) for the storage of and retrieval of data. Initially computers used individual memory units mounted directly onto the computer's main board, i.e., the system or mother board. As computers, and the programs used therein, increased in size and complexity, more and faster memory units were required and the system boards could not accommodate a sufficient number of individual memory units.

The initial solution to this problem was to create a memory module, formed of a plurality of individual memory units. These memory modules are still in use and known as Single In-line Memory Modules, herein after referred to as SIMMs. To accommodate these SIMMs, suitable sized sockets were provided on the system board. The use of these SIMMs and accommodating sockets significantly expanded the memory capacity of the computer. Initially the SIMMs were designed as 30 pin, 8 bit wide assemblies which mated with a suitable 30 pin female socket. Soon however increasing computer memory demands saw the introduction of a memory module extender which permitted single 30 pin SIMM sockets to receive a plurality of 30 pin SIMMs.

However industry advances saw the introduction of a faster, enlarged memory 72 Pin, 32 bit wide SIMM which required a mating 72 pin socket.

With these changes, the owners of older computers were again faced with either the foregoing of the advantages of these new 72 pin, 32 bit wide SIMMs or buying new computers.

A solution to this problem was the design of a memory module adaptor that was configured to permit a plurality of 30 pin 8 bit SIMMs to function as a single high order 72 pin, 32 bit SIMM.

Although the above solutions proved viable, the appetite of the computer industry for more and faster memory continues unabated.

To meet these further higher memory demands, 168 pin, 64 bit Dual In-line Memory Modules, hereinafter referred to as DIMMs, which require 168 pin sockets are now the industry standard. These DIMMs cannot be accommodated in either the 30 pin 8 bit or the 72 pin 32 bit SIMM sockets.

Additionally there also exists a standard for a 16 byte, 278 pin DIMM memory module which also cannot be accommodated by either the 30 pin 8 bit or the 72 pin 32 bit SIMM sockets.

To further complicate the issue, system architectures vary and this, in turn, causes the arrangement of the circuitry on the module to vary to match the architecture of the system. Thus the module manufacturers find, that to accommodate industry demands for memory modules, they must produce both the older SIMMs and the newer DIMMs.

Thus there exists a need for a single memory module that can be accommodated by computers having, on their system boards, either SIMM sockets or DIMM sockets.

Specifically there exists a need for a single memory module that can be accommodated by computers having, on their system boards, either 72 pin, 4 byte (i.e., 32 bit) SIMM sockets or 168 pin, 8 byte (i.e. 64 bit) DIMM sockets.

Still further there exists a need for a memory module that can be accommodated by computers having, on their system boards, either 168 pin, 64 bit DIMM sockets or 278 pin, 128 bit DIMMs.

SUMMARY OF THE INVENTION

The present invention is directed to a single memory module which can be accommodated by both old and new computers for it can be plugged into a SIMM socket so that it can serve as either a SIMM or alternately can be plugged into a DIMM socket so that it can serve as a DIMM.

The present invention thus provides a single memory module which can be plugged into computer systems using either the older SIMM sockets or the newer DIMM sockets.

The present invention accomplishes this by providing a memory module card that is configured to interface with the latest computer architectures that use large memory DIMMs as well as the older computer architectures that can only use the small memory SIMMs.

In the preferred embodiment, the invention uses a memory module card, that is designed to emulate a DIMM when plugged into a DIMM socket and to emulate a SIMM when plugged into a SIMM socket.

The present invention thus not only decreases the need for manufacturing and maintaining an inventory of the older outdated SIMMs but also provides users of older computers with the capability of extending the useful life of their existing computer system even if the SIMMs or memory expansion cards designed for the computer no longer exist or are prohibitively expensive or very difficult to locate.

Accordingly, the invention provides a memory module that will interact with computer systems that employ different architectures.

The invention thus provides a memory module that will interact with computer systems that employ either SIMM or DIMM architectures or with computer systems that employ different DIMM architectures.

The invention thus provides a memory module that, when inserted in a proper socket, serves as either a 72 pin SIMM memory module or a 168 pin DIMM or a 278 DIMM memory module;

The invention also provides a memory module that, when inserted in a proper socket, serves as either a 168 pin DIMM memory module or a 278 pin DIMM memory module;

These and other objects and features of the present invention will become further apparent from the following description taken in conjunction with the drawings.

DESCRIPTION OF THE PREFERRED EMBODIMENT

Figure 1:
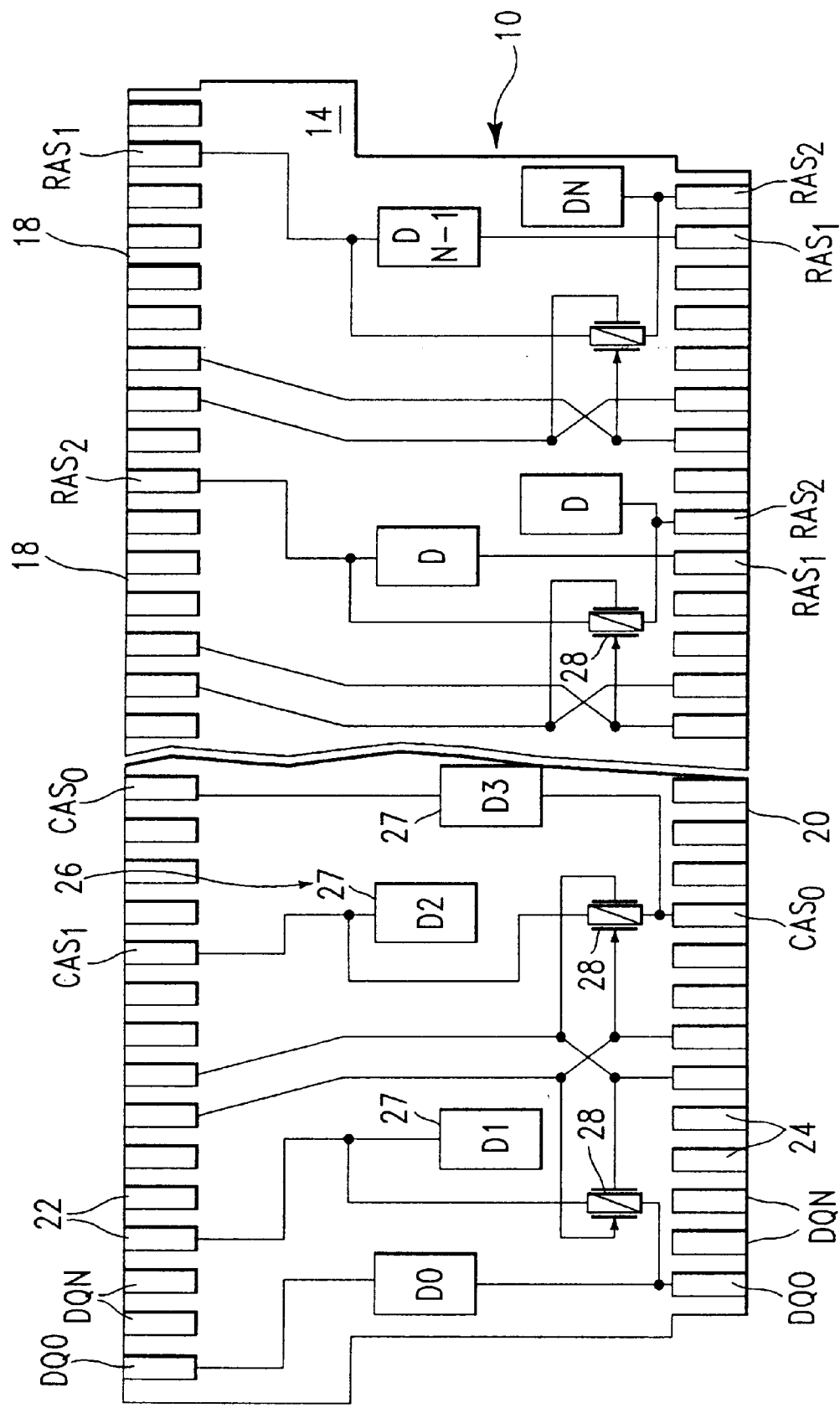
FIG. 1 is a partial plan view of a memory module that incorporates the features of the present invention and when inserted in a proper socket serves as either a SIMM memory module or a DIMM memory module.

FIG. 1 shows, in schematic form, a generalized partial plan view of a memory module incorporating the present invention which permits the memory module card to serve as either a DIMM or a SIMM.

The memory module of FIG. 1 comprises a printed circuit card 10 formed, in a conventional manner, of insulating material and having major front and rear surfaces of which only the front surface 14 is shown. Arranged along first and second longitudinal edges 18 and 20, on both the front and rear surfaces, are a plurality of electrical I/O terminals, or pads 22 and 24 positioned adjacent the edges 18 and 20. It should be noted that the edges 18 and 20 are of different lengths and have different numbers of pads thereon.

Carried on the front face 14 is a memory circuit 26 formed of a plurality of interconnected Dynamic Random Access Memory (DRAM) arrays 27. For clarity of illustration, only eight of these DRAM arrays, e.g., $D_0$, $D_1$, $D_2$, $D_3$, $D_{N-1}$ and $D_N$ are shown in FIG. 1. Connected to these DRAM arrays 27 are a plurality of pass gate circuits 28. When the DRAM arrays and the pass gate circuits are mounted on the card 10 and electrically coupled to one another and to select ones of the pads 22 and 24 along card edges 18 and 20 respectively and when a particular edge of the card is inserted in an appropriate mating DIMM or SIMM socket (not shown), mounted on a computer system board, the pass gate circuits arc selectively activated or deactivated by selective biasing of the pass gate circuits. By this selective activation and deactivation of the pass gate circuits the circuit interconnection of the of the DRAM arrays 27 is changed so that the module operates as either a SIMM when inserted into a SIMM socket or as a DIMM when inserted into a DIMM socket. More specifically, in the described embodiment, the selective activation and deactivation of the pass gate circuits alters the circuit interconnection of the of the DRAM arrays 27 so that the module can operate, for example, as either a two bank, 4 byte wide, 72 pin SIMM when inserted into a SIMM socket and as a single bank, 8 byte wide 168 pin DIMM when inserted into a DIMM socket.

It should be understood that two bank, 4 byte wide, 72 pin SIMMs and single bank, 8 byte wide, 168 pin DIMMs are well known to the art and conform to standards established by the Joint Electron Device Engineering Council (JEDEC) and can be found in any number of published handbooks and need not be further described herein. It should be further understood that both SIMM and DIMM sockets as well as their specific pin inputs are also well known to the art and conform to standards established by JEDEC. To this end, in this specific embodiment, the edge 18 is designed to mate with a JEDEC standard 168 pin DIMM memory socket and the edge 20 designed to mate with a JEDEC standard 72 pin SIMM memory socket. Additionally, it should be understood that many computer systems will connect one or more of the JEDEC-standard RAS inputs together, and therefore, the RAS signals described herein are taken to be generic RAS inputs.

Figure 3:
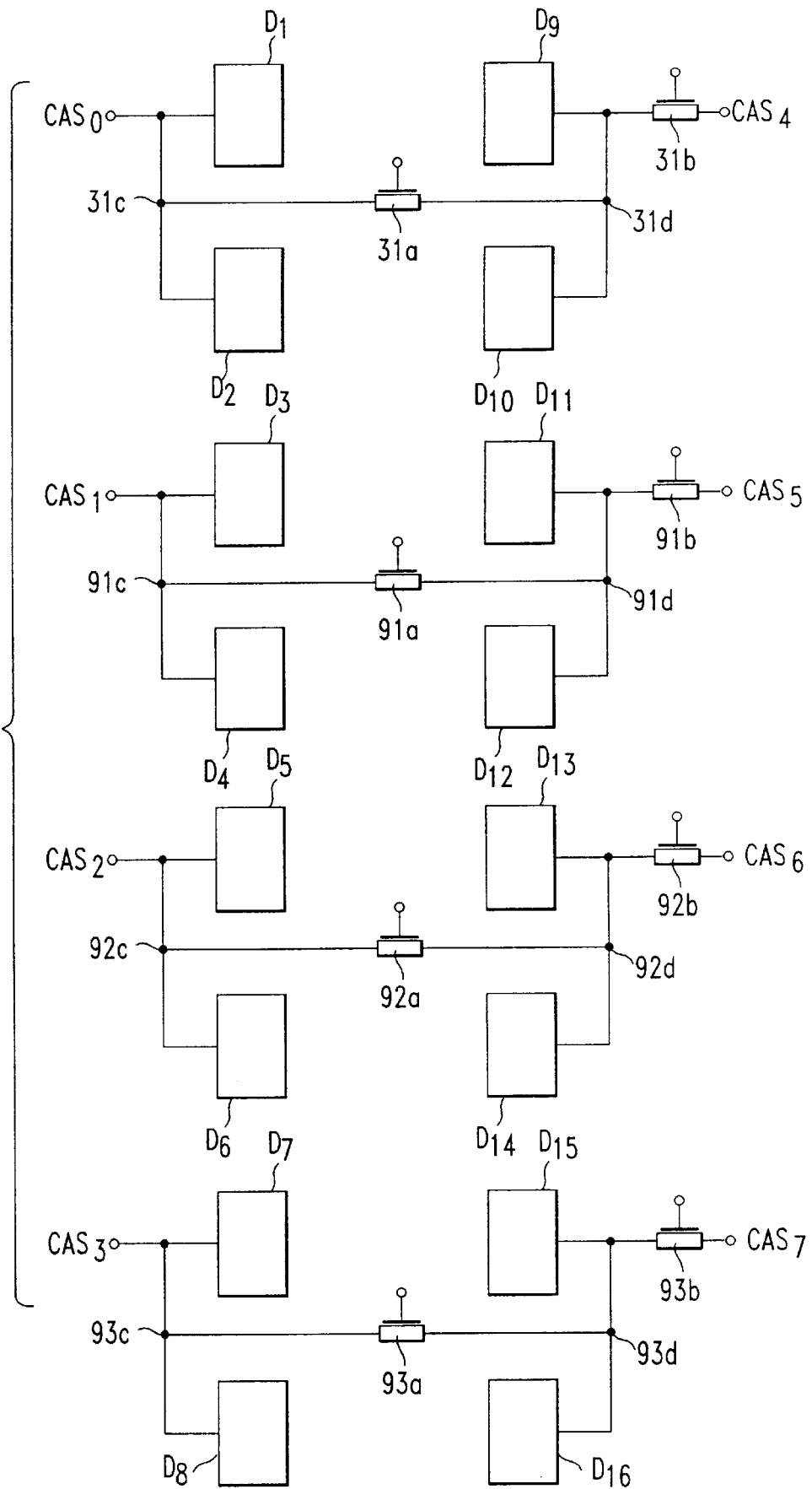
FIG. 3 is a further detail of the circuit of FIG. 2 showing the Column Address Strobe connections to the memory module.

In actuality, to provide a two bank, 4 byte wide, 72 pin SIMM or a single bank, 8 byte wide 168 pin DIMM the memory circuit 26 is comprised of sixteen DRAM arrays arranged in two tiers of eight each as shown in FIG. 3. Further the card must have a sufficient number of pass gate circuits which, when properly activated, will alter the module interconnections in order that the memory module can act as either a two bank, 4 byte wide, 72 pin SIMM or as a single bank, 8 byte wide 168 pin DIMM.

Figure 2:
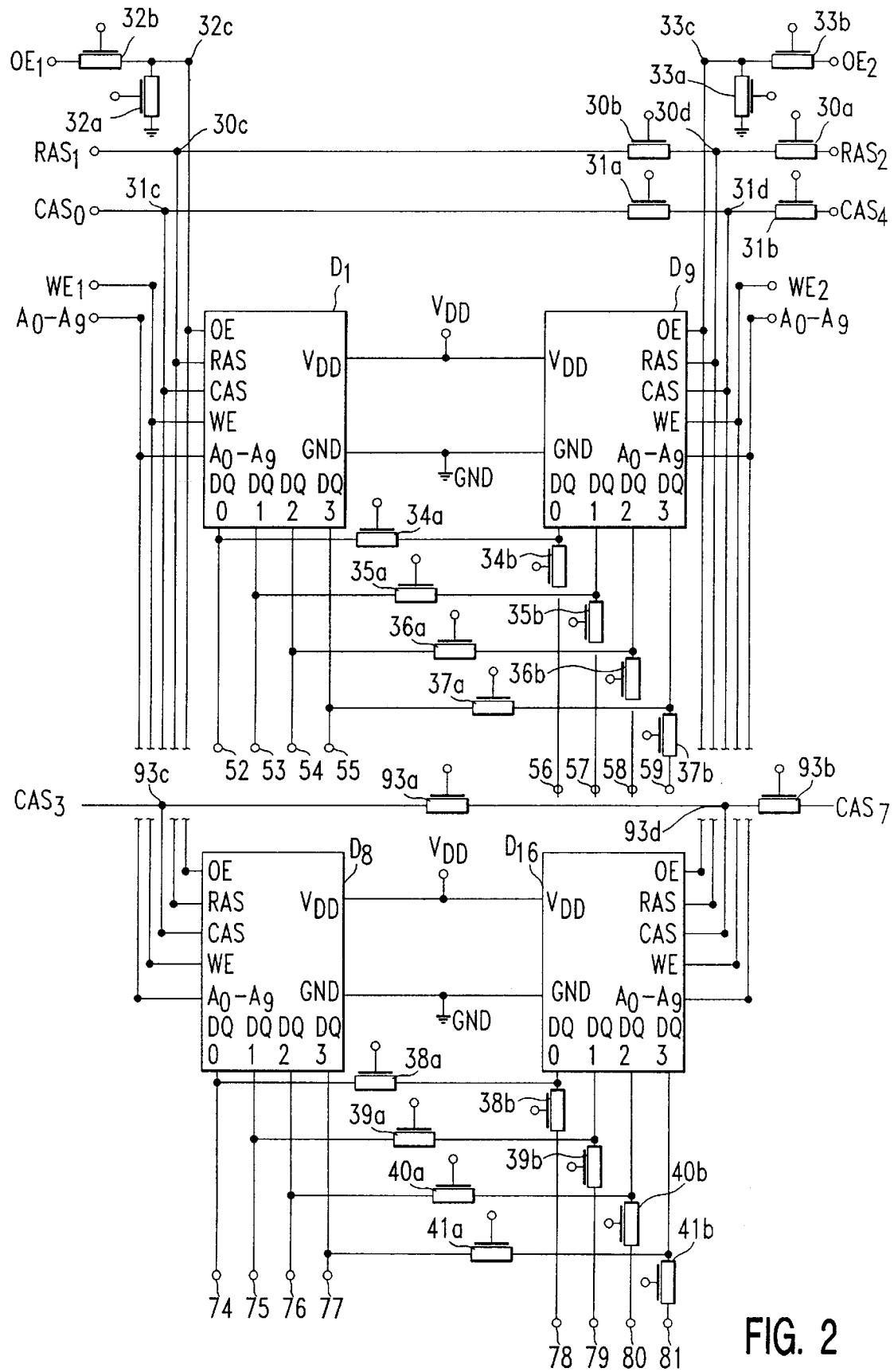
FIG. 2 is a partial schematic of a memory module incorporating the present invention.

Since FIG. 1 is merely illustrative, the actual positioning of the DRAM arrays and the pass gate circuits, with respect to the DRAM arrays, will be discussed below in conjunction with the detailed description of the circuitry interconnecting the DRAM arrays as shown in FIGS. 2 and 3.

As previously noted, the card 10 utilizes a pad arrangement on edge 18 that mates with a DIMM socket and a pad arrangement on edge 20 that mates with a SIMM socket. To facilitate enabling of the different states of the card 10 by either of the presently available DIMM and SIMM sockets, the pass gates circuits 28 and the DRAM arrays 27 are connected to designated pads on the edges 18 and 20 such that when the card 10 has its edge 20 inserted into a prior art 72 pin SIMM socket, the circuit connections to the pads 24 adjacent the edge 20 will configure the DRAM arrays 27 to operate as a 2 bank, 4 byte wide 72 pin SIMM and when edge 18 is inserted into a prior art 168 pin DIMM socket, the circuit connections to the pads 22 adjacent the edge 18 will configure the DRAM arrays 27 to operate as a single bank, 8 byte wide 168 pin DIMM.

Thus the edge 18 of the card 10 will be referred to as the DIMM memory edge for it is configured for insertion in and mating with a standard DIMM memory socket and is thus 5.25 inches long and the edge 20 will be referred to as the SIMM memory edge for it is configured for insertion in and mating with by a standard SIMM memory socket and is only 4.25 inches long.

To accomplish this circuit alteration, the pads 24 adjacent edge 20 will have to be connected to the DRAMS 27, and pass gate circuits 28 in a slightly different order or position than the way the pads 22 on edge 18 in FIG. 1 are connected.

FIG. 2 is a partial schematic of a memory module incorporating the present invention. In this schematic only four of the eighteen DRAM arrays normally found in a two bank, 4 byte wide, 72 pin SIMM or a single bank, 8 byte wide 168 pin DIMM, are shown. More particularly, in this FIG. 2, only the first DRAM arrays D $D_9$, and the last DRAM arrays $D_8$, and $D_{16}$ of each bank of arrays are shown.

Each DRAM array has a number of inputs which are labeled in accordance with the signals to be placed thereon by a system board when the edges 18 or 20 are respectively inserted in appropriate sockets. These inputs are defined as:

$RAS_1$ and $RAS_2$ are the Row Address Strobes;
$CAS_0$ through $CAS_7$ are the Column Address Strobes;
$OE_1$ and $OE_2$ are the Output Enable signals;
$WE_1$ and $WE_2$ are the Write signals;
$A_0$ to $A_9$ are Address signals;
$DQ_0$ through $DQ_3$ are bidirectional input/output points;
GND is the system ground contact; and
$V_{DD}$ is the system voltage contact.

As shown in FIG. 3, there are eight CAS inputs, i.e., $CAS_0$ through $CAS_7$, with each coupled to a respective pair of arrays. Thus $CAS_0$ is connected to the DRAM arrays $D_1$ and $D_2$ and $CAS_4$ is connected to the DRAM arrays $D_9$ and $D_{10}$, $CAS_1$ is connected to the DRAM arrays $D_3$ and $D_4$, $CAS_5$ is connected to the DRAM arrays $D_{11}$ and $D_{12}$, $CAS_2$ is connected to the DRAM arrays $D_5$ and $D_6$, $CAS_6$ is connected to the DRAM arrays $D_{13}$ and $D_{14}$, and $CAS_3$ is connected to the DRAM arrays $D_7$ and $D_8$ and $CAS_7$ is connected to the DRAM arrays $D_{15}$ and $D_{16}$.

The RAS and OE inputs are coupled through respective pass gate circuits formed of CMOS transistor pairs 30a and 30b, 32a and 32b, 33a and 33b respectively while the CAS inputs are as shown in FIG. 3 coupled through pass gate circuits formed of CMOS transistor pairs 31 a and 3 1b, 91 a and 91b, 92a and 92b and 93a and 93b, Transistors 30a, 31a, 32a, 33a, 91a, 92a, and 93a are N-type transistors and transistors 30b, 31b, 32b, 33b, 91b, 92b and 93b are P-type transistors.

Bi-directional input/output points $DQ_0$ through $DQ_3$ on each DRAM are similarly controlled through respective pass gate circuits. Specifically, as shown in FIG. 2, the input/output points $DQ_0$ through $DQ_3$ of DRAM array $D_9$ can be respectively transferred to the input/output points $DQ_0$ through $DQ_3$, of DRAM array $D_1$ by respective pass gate circuits formed of CMOS transistor pairs 34a and 34b, 35a and 35b, 36a and 36b and 37a and 37b wherein transistors 34a, 35a, 36a, and 37a are N-type transistors and transistors 34b, 35b, 36b and 37b are P-type transistors and the input/output points $DQ_0$ through $DQ_3$ of DRAM array $D_{16}$ can be respectively transferred to the input/output points $DQ_0$ through $DQ_3$ of DRAM array $D_8$ by respective pass gate circuits formed of CMOS transistor pairs 38a and 38b, 39a and 39b, 40a and 40b and 41a and 41b wherein transistors 38a, 39a, 40a, and 41a are N-type transistors and transistors 38b, 39b, 40b and 41b are P-type transistors. It should be especially noted that the input/output points $DQ_0$ through $DQ_3$ of the arrays $D_{10}$ through $D_{15}$ can be transferred to the input/output points $DQ_0$ through $DQ_3$ of the arrays $D_2$ through $D_7$ in an identical manner.

This will be made clearer from the following two specific examples taken in conjunction with FIG. 2.

EXAMPLE 1

In this first example it will be assumed that the card edge 20 is inserted into a SIMM socket mounted on a computer system board, i.e., the DRAM arrays 27 are coupled as a two bank, 4 byte wide, 72 pin SIMM.

In this socket the gates of transistors 30a, 31a, 32a, 33a, 34a, 35a, 36a, 37a, 38a, 39a, 40a, 41a, 91a, 92a and 93a are all coupled to VDD and are turned on, and the gates of transistors 30b,31b, 32b, 33b, 34b, 35b, 36b, 37b, 38b, 39b, 40b, 41b, 91b, 92b and 93b are also all coupled to the voltage supply $V_{DD}$ and are all turned off. When the transistor 30b turns off, the nodes 30c and 30d become isolated from each other, and simultaneously, through the turning on of transistor 30a, the $RAS_2$ input becomes connected to node 30d and thus to the DRAM arrays $D_9$ through $D_{16}$. In this condition the RAS input is supplied to the DRAM arrays $D_1$ through $D_9$ and the $RAS_2$ input is supplied to the DRAM arrays $D_9$ through $D_{16}$.

It should be noted that transistor 30a can be eliminated without affecting the operation of the circuit for only when the printed circuit card edge 18 is inserted in a DIMM socket is the $RAS_2$ node connected to a signal input source. In the present example, when the card edge 20 is inserted in a SIMM socket the $RAS_2$ node is unconnected.

When transistor 31b turns off, the $CAS_4$ input node becomes isolated from node 31d and arrays $D_9$ and $D_{10}$. Because transistor 31a simultaneously turns on, the nodes 31c and 31d become connected to one another through transistor 31a and the $CAS_0$ input becomes connected to the DRAM arrays $D_1$, $D_2$, $D_9$, $D_{10}$. Simultaneously, the transistors 91b, 92b and 93b connected between the inputs $CAS_5$ through $CAS_7$ also turn off disconnecting them from their respective DRAM arrays $D_{10}$ through $D_{16}$ while other transistors 91a, 92a and 93a all turn on to connect the $CAS_1$ input to the DRAM arrays $D_{11}$ and $D_{12}$, via nodes 91c and 91d, the $CAS_2$ input to the DRAM arrays $D_{13}$ and $D_{14}$, via nodes 92c and 92d, and the $CAS_3$ input to the DRAM arrays $D_{15}$ and $D_{16}$, via nodes 93c and 93d.

It should be noted that the transistors 31b, 91b, 92b, and 93b that connect the $CAS_4$ through $CAS_7$ input nodes to their respective arrays $D_9$ through $D_{16}$ can be eliminated without affecting the operation of the circuit for only when the printed circuit card edge 18 is inserted in a DIMM socket are the $CAS_4$ through $CAS_7$ inputs connected to appropriate signal input sources. In the present example, when the card edge 20 is inserted in a SIMM socket the $CAS_4$ through $CAS_7$ inputs are unconnected.

At the same time transistors 32a and 33a both turn on and transistors 32b and 33b both turn off. With the turning off of transistors 32b and 33b the $OE_1$ and $OE_2$ input nodes become disconnected from nodes 32c and 33c and with the turning on of transistors 32a and 33a the nodes 32c and 33c are connected to ground.

When transistors 34b, 35b, 36b, and 37b, turn off, the input/output nodes 56, 57, 58 and 59 are isolated from the input/output points $DQ_0$ through $DQ_3$ of DRAM array $D_9$ and the simultaneous turning on of transistors 34a, 35a, 36a, and 37a, respectively connect the bi-directional input/output points $DQ_0$ through $DQ_3$ of DRAM array $D_9$ to the input/output nodes 52, 53, 54, and 55 and the input/output points $DQ_0$ through $DQ_3$ of DRAM array $D_1$.

Similarly, when transistors 38b, 39b, 40b, and 41b all turn off, the input/output nodes 78, 79, 80 and 81 are isolated from the input/output points $DQ_0$ through $DQ_3$ of DRAM array $D_{16}$ and the simultaneous turning on of transistors 38a, 39a, 40a, and 41a, respectively connect the bi-directional input/output points $DQ_0$ through $DQ_3$, of DRAM array $D_{16}$ to the input/output nodes 74, 75, 76, and 77 and the input/output points $DQ_0$ through $DQ_3$ of DRAM array $D_8$.

It should be noted that transistors 34b through 41b can be eliminated again without affecting the operation of the circuit for only when the printed circuit card edge 18 is inserted in a DIMM socket is the are the input/output points $DQ_0$ through $DQ_3$ of DRAM array $D_9$ through $D_{16}$ connected to active input/output pads and, as in the present example, when the card edge 20 is inserted in a SIMM socket these nodes are unconnected.

It is of course understood that the other DRAM arrays are similarly interconnected. That is, the input/output points $DQ_0$ through $DQ_3$ of each of the DRAM arrays pairs $D_2$ through $D_7$ and $D_{10}$ through $D_{15}$ are similarly connected but, for clarity of illustration are not shown in this FIG. 2.

Thus by connecting the sixteen DRAM arrays $D_1$ through $D_{16}$, as set forth above, they are now connected as a two bank, 4 byte wide, 72 pin SIMM.

EXAMPLE 2

In this second example it will be assumed that the card edge 18 is inserted into a DIMM socket mounted on a computer system board, i.e., the DRAM arrays 27 are to be coupled as a single bank, 8 byte wide 168 pin DIMM.

In this socket the gates of transistors 30b, 31b, 32b, 33b, 34b, 35b, 36b, 37b, 38b, 39b, 40b and 41b are all coupled to ground (GND) and are turned on, and the gates of transistors 30a, 31a, 32a, 33a, 34a, 35a, 36a, 37a, 38a, 39a, 40a, and 41a are all coupled to the GND and are all turned off. When the transistor 30b turns on the nodes 30c and 30d become connected to each other and simultaneously, through the turning off of transistor 30a, the RAS input becomes disconnected from node 30d and thus from the DRAM arrays Dg through $D_{16}$. In this condition the $RAS_1$ input is supplied to both banks of DRAM arrays $D_1$ through $D_{16}$ Again, it should be noted that the transistors 30a and 31b and transistors 34b through 41b can be eliminated without affecting the operation of the circuit. Upon insertion into the socket the $CAS_0$, $CAS_1$, $CAS_2$, and $CAS_3$ inputs are connected to the respective DRAM arrays $D_1$ to $D_8$, as shown in FIG. 3.

When transistor 31b turns on the $CAS_4$ input node is connected to node 31d and thus to the arrays $D_9$ and $D_{10}$.

However because transistor 31a simultaneously turns off, the nodes 31c and 31d become disconnected one from the other and the $CAS_0$ and the $CAS_4$ inputs do not interfere with one another. Simultaneously, other transistors 91b, 92b, 93b similar to transistor 31b, are coupled to the $CAS_5$, $CAS_6$, and $CAS_7$ inputs, also turn on to respectively connect $CAS_5$, $CAS_6$, and $CAS_7$ inputs to the DRAM arrays $D_{11}$ to $D_{16}$. Again however because transistors 91a, 92a and 93a, similar to transistor 31a, simultaneously turn off, the $CAS_5$, $CAS_6$, and $CAS_7$ inputs are prevented from interfering with the $CAS_1$, $CAS_2$, and $CAS_3$ inputs.

At the same time transistors 32a and 33a both turn off transistors 32b and 33b both turn on. With the turning on of transistors 32b and 33b, the input nodes $OE_1$ and $OE_2$ become connected to nodes 32c and 33c, and with the turning off of transistors 32a and 33a, the nodes 32c and 33c are disconnected from ground.

When transistors 34a, 35a, 36a, and 37a, turn off, the input/output points $DQ_0$ through $DQ_3$ of DRAM array $D_9$ are isolated from the input/output points $DQ_0$ through $DQ_3$ of DRAM array $D_1$ and the simultaneous turning on of transistors 34b, 35b, 36b, and 37b, respectively connect the bi-directional input/output points $DQ_0$ through $DQ_3$ of DRAM array $D_9$ to the input/output nodes 56, 57, 58, and 59.

Similarly when transistors 38a, 39a, 40a, and 41a all turn off, the input/output points $DQ_0$ through $DQ_3$ of DRAM array $D_{16}$ are isolated from the input/output points $DQ_0$ through $DQ_3$ of DRAM array $D_8$, and the simultaneous turning on of transistors 38a, 39a, 40a, and 41a, respectively connect the bidirectional input/output points $DQ_0$ through $DQ_3$, of DRAM array $D_{16}$ to the input/output nodes 78, 79, 80, and 81.

The other DRAM arrays are similarly interconnected, as discussed above in Example 1, such that the sixteen DRAM arrays $D_1$ through $D_{16}$ are now connected as a single bank, 8 byte wide 168 pin DIMM.

It should be noted that CMOS transistor pairs, although preferred as the pass gate circuits, are not necessary and that any transistor when suitably biased can be used.

Thus, it can be seen that in the above described embodiment, the module circuit card of the invention provides a circuit mounted on the card body and to select pads of both a first and second edge such that, upon insertion of the first edge into a first card socket of the system board, the circuit is altered to act as a two bank, 4 byte wide, 72 pin SIMM and upon insertion of the second edge into a second card socket, the circuit unit is altered to act as a single bank, 8 byte wide 168 pin DIMM.

It should now be noted that 16 byte wide, 278 pin DIMMs are also well known to the art and conform to standards established by the Joint Electron Device Engineering Council (JEDEC) and a description thereof can be found in any number of published handbooks. Thus, this prior art information, in conjunction with the above description of the present invention, will enable one, skilled in the art, to readily alter the pad arrangements and circuit configurations on the card 10 to provide a memory module that, when inserted in a proper socket, serves as either a 168 pin DIMM memory module or a 278 pin DIMM memory module.

While the invention has been particularly described with respect to a preferred embodiment and several variations thereon, it should be understood that one skilled in the art can, from the foregoing, readily make further changes in form and detail without departing from the spirit and scope of the invention.

What is claimed is:

1. A memory module card for use with computer system boards having module card receiving sockets thereon, each of said sockets containing a plurality of electrically powered contacts for contacting pads adjacent a received memory module card edge to enable circuit units on the memory module card, comprising:

a substantially planar card body comprised of insulative material having a first edge and a second edge;

said first edge being adapted to be inserted into a first module card receiving socket on a computer board and being different in length than said second edge;

said second edge being adapted to be inserted into a second module card receiving socket on a computer board;

a plurality of pads mounted along said first and said second edges of said card; and a plurality of memory arrays mounted on said card body and connected, through a plurality of semiconductor devices, to selected pads mounted along said first and second edges such that, upon insertion of said first edge into a first module card receiving socket, said semiconductor devices are selectively switched to interconnect all of said memory arrays as a first memory architecture and upon insertion of said second edge into a second module card receiving socket, said semiconductor devices are selectively switched to interconnect all of said memory arrays as a second memory architecture.

2. The memory card of claim 1 wherein said first socket is a DIMM socket and said second socket is a SIMM socket.

3. The memory card of claim 1 wherein said first socket is a first DIMM socket having a selected number of electrically powered contacts for contacting pads adjacent a received memory module card edge to connect the memory arrays on the memory module card in a first bank configuration and said second socket is a second DIMM socket having a selected number of electrically powered contacts different from the number of contacts in said first DIMM socket for contacting pads adjacent a received memory module card edge to connect the memory arrays on the memory module card in a second bank configuration different from the first bank configuration.

4. The circuit card of claim 1 wherein:

the first socket is longer in length than second socket; and said first and second edges of said memory module card have different respective lengths equal to the respective lengths of the first and second card sockets to allow only an appropriate card edge to be inserted into a given socket.

5. A memory module card for use with computer system boards having module card receiving sockets thereon, each of said sockets containing a plurality of electrically powered contacts for contacting pads adjacent a received memory module card edge to enable circuit units on the memory module card, comprising:

a substantially planar card body comprised of insulative material having a first edge and a second edge;

said first edge being adapted to be inserted into a first module card receiving socket on a computer board and being different in length than said second edge;

said second edge being adapted to be inserted into a second module card receiving socket on a computer board;

a plurality of pads mounted along said first and said second edges of said card; and a plurality of memory arrays mounted on said card body and connected, through a plurality of semiconductor devices, to selected pads mounted along said first and second edges such that, upon insertion of said first edge into a first module card receiving socket, said arrays are interconnected as a first memory architecture and upon insertion of said second edge into a second module card receiving socket, said arrays are interconnected as a second memory architecture;

said first socket being a DIMM socket and said second socket being a SIMM socket;

said plurality of arrays being DRAM arrays mounted on said card body and connected, through a plurality of complementary field effect transistors, to selected pads mounted along said first edge such that, upon insertion of said first edge into a DIMM card socket, said arrays are interconnected as a single bank, 8 byte wide, 168 pin DIMM and to selected pads mounted along said second edge such that, upon insertion of said second edge into a SIMM card socket, said arrays are interconnected as a two bank, 4 byte wide, 72 pin SIMM.

6. A memory module card for use with computer system boards having module card receiving sockets thereon each of said sockets containing a plurality of electrically powered contacts for contacting pads adjacent a received memory module card edge to enable circuit units on the memory module card, comprising:

a substantially planar card body comprised of insulative material having a first edge and a second edge;

said first edge being adapted to be inserted into a first module card receiving socket on a computer board and being different in length than said second edge;

said second edge being adapted to be inserted into a second module card receiving socket on a computer board;

a plurality of pads mounted along said first and said second edges of said card; and a plurality of memory arrays mounted on said card body and connected, through a plurality of semiconductor devices, to selected pads mounted along said first and second edges such that, upon insertion of said first edge into a first module card receiving socket, said arrays are interconnected as a first memory architecture and upon insertion of said second edge into a second module card receiving socket, said arrays are interconnected as a second memory architecture;

said first socket being a DIMM socket and said second socket being a SIMM socket;

said plurality of arrays are DRAM arrays mounted on said card body and connected, through a plurality of complementary field effect transistors, to selected pads mounted along said first and second edges such that, upon insertion of said first edge into a DIMM card socket, said arrays are interconnected as a single bank, 16 byte wide, 278 pin DIMM and upon insertion of said second edge into a SIMM card socket, said arrays are interconnected as a four bank, 4 byte wide, 72 pin SIMM.

7. A memory module card for use with computer system boards having module card receiving sockets thereon, each of said sockets containing a plurality of electrically powered contacts for contacting pads adjacent a received memory module card edge to enable circuit units on the memory module card, comprising:

a substantially planar card body comprised of insulative material having a first edge and a second edge;

said first edge being adapted to be inserted into a first module card receiving socket on a computer board and being different in length than said second edge;

said second edge being adapted to be inserted into a second module card receiving socket on a computer board;

a plurality of pads mounted along said first and said second edges of said card; and a plurality of memory arrays mounted on said card body and connected, through a plurality of semiconductor devices, to selected pads mounted along said first and second edges such that, upon insertion of said first edge into a first module card receiving socket, said semiconductor devices are selectively switched to interconnect all of said memory arrays as a first memory architecture and upon insertion of said second edge into a second module card receiving socket, said semiconductor devices are selectively switched to interconnect all of said memory arrays as a second memory architecture;

said first socket being a first DIMM socket having a selected number of electrically powered contacts for contacting pads adjacent a received memory module card edge to connect the memory arrays on the memory module card in a first bank configuration and said second socket being a second DIMM socket having a selected number of electrically powered contacts different from the number of contacts in said first DIMM socket for contacting pads adjacent a received memory module card edge to connect the memory arrays on the memory module card in a second bank configuration different from the first bank configuration;

said plurality of arrays being DRAM arrays mounted on said card body and connected, through a plurality of complementary field effect transistors, to selected pads mounted along said first and second edges such that, upon insertion of said first edge into said first DIMM card socket, said arrays are interconnected as a single bank, 16 byte wide 278 pin DIMM and upon insertion of said second edge into said second DIMM card socket, said arrays are interconnected as a dual bank 8 byte wide, 168 pin DIMM.

8. A memory module card, for use with system boards having card sockets for receiving the edge of a circuit card, said sockets containing a plurality of electrically powered contacts for contacting pads adjacent the received card edge, comprising:

a substantially planar printed circuit card comprised of insulative material and having first and second substantially parallel major edges;

a plurality of pads mounted along said first edge and along said second edge;

a plurality of interconnected memory arrays mounted on said card;

a plurality of transistors coupling said memory arrays to selected ones of said pads along said first and said second edges, said first edge being adapted to be inserted into a first socket and being longer in length than said second edge and said second edge being adapted to be inserted into a second socket;

a plurality of memory arrays are mounted on said card and connected, through a plurality of transistors, to selected pads mounted along said first and second edges;

said arrays being connected through said transistors to said selected pads mounted along said first edge such that, upon insertion of said first edge into a first card socket, said transistors are activated to interconnect said memory arrays as a two bank, 4 byte wide, 72 pin SIMM; and said arrays being connected through said transistors to said selected pads mounted along said second edge such that, upon insertion of said second edge into a second card socket, said transistors are activated to interconnect said memory arrays as a single bank, 8 byte wide 168 pin DIMM.

9. The circuit card of claim 8 wherein:

said memory arrays are DRAM arrays and said transistors arc complementary field effect transistors.

10. A computer comprising:

a system board; and a printed circuit card affixed to said system board comprising:

a substantially planar card body comprised of insulative material;

a plurality of pads mounted along a first edge and a second edge of said card body; and memory arrays mounted on said card body; said memory arrays being coupled to the pads mounted along said first edge such that, when only said first edge is electrically coupled to said system board, said memory arrays are interconnected as a single bank, 8 byte wide 168 pin DIMM and said memory arrays being further coupled to the pads mounted along said second edge such that, when only said second edge is electrically coupled to said system board, said memory arrays are interconnected as a two bank, 4 byte wide, 72 pin SIMM.

11. In a computer having a system board:

a circuit card mounted on said system board;

said circuit card comprising:

a substantially planar card body comprised of insulative material;

a plurality of pads mounted along a first edge and a second edge of said card body; and memory arrays and circuit units mounted on said card body and connected to pads mounted along said first and second edges, said memory arrays and circuit units being connected to the pads mounted along said first edge such that, when only said first edge is electrically coupled to said system board said memory arrays and circuit units are interconnected as a single bank, 8 byte wide, 168 pin DIMM and said memory arrays and circuit units being connected to the pads mounted along said second edge such that, when only said second edge is electrically coupled to said system board, said memory arrays and circuit units are interconnected as a two bank, 4 byte wide, 72 pin SIMM.

12. A computer comprising:

a system board; and a printed circuit card coupled to said system board comprising:

a substantially planar card body comprised of insulative material;

a plurality of pads mounted along a first edge and a second edge of said card; and memory array units mounted on said card body, said memory array units being coupled to the pads mounted along said first edge such that, upon the electrical coupling of only the pads along said first edge to said system board, said memory array units are interconnected as a single bank, 16 byte wide, 278 pin DIMM and said memory array units being further coupled to pads mounted along said second edge such that, upon the electrical coupling of only the pads along said second edge to said system board, said memory array units are interconnected as a dual bank, 8 byte wide, 168 pin DIMM.

13. In a computer having a system board: and a circuit card mounted on said system board;

said circuit card comprising:

a substantially planar card body comprised of insulative material;

a plurality of pads mounted along a first edge and a second edge of said card; and first and second circuit units mounted on said card body, said first and second circuit units being interconnected to each other and connected to the pads mounted along said first edge such that, upon the electrical coupling of only the pads along said first edge to said system board, said circuit units are interconnected as a single bank, 16 byte wide, 278 pin DIMM and said first and second circuit units being further interconnected to each other and connected to the pads mounted along said second edge such that, upon the electrical coupling of only the pads along said second edge to said system board, said circuit units are interconnected as a dual bank, 8 byte wide, 168 pin DIMM.

* * * * *